United States Patent [19]

Schumann et al.

[11] Patent Number: 5,732,017

[45] Date of Patent: Mar. 24, 1998

[54] COMBINED PROGRAM AND DATA NONVOLATILE MEMORY WITH CONCURRENT PROGRAM-READ/DATA WRITE CAPABILITY

[75] Inventors: Steven J. Schumann, Sunnyvale; Fai Ching; Sai K. Tsang, both of Fremont, all of Calif.

[73] Assignee: Atmel Corporation, San Jose, Calif.

[21] Appl. No.: 829,378

[22] Filed: Mar. 31, 1997

[51] Int. Cl.$^6$ ............................................. G11C 11/34
[52] U.S. Cl. ........................... 365/185.11; 365/185.21; 365/189.04; 365/230.08
[58] Field of Search ..................... 365/185.21, 185.11, 365/185.23, 189.04, 189.05, 230.08, 230.03

[56] References Cited

U.S. PATENT DOCUMENTS

| 3,471,838 | 10/1969 | Ricketts et al. | 340/174 |
|---|---|---|---|
| 5,229,972 | 7/1993 | Kondo et al. | 365/185.11 X |
| 5,245,572 | 9/1993 | Kosonocky et al. | 365/185.11 X |
| 5,307,314 | 4/1994 | Lee | 365/189.04 |
| 5,361,343 | 11/1994 | Kosonocky et al. | 395/425 |
| 5,367,494 | 11/1994 | Shebanow et al. | 365/230.03 |
| 5,420,997 | 5/1995 | Browning et al. | 395/425 |
| 5,436,863 | 7/1995 | Kogure | 365/189.04 |
| 5,475,634 | 12/1995 | Wang et al. | 365/230.08 |
| 5,502,683 | 3/1996 | Marchioro | 365/230.05 |
| 5,513,139 | 4/1996 | Butler | 365/189.04 |
| 5,553,016 | 9/1996 | Takebuchi | 365/185.11 X |

*Primary Examiner*—Son T. Dinh
*Assistant Examiner*—Huan Hoang
*Attorney, Agent, or Firm*—Thomas Schneck; Mark Protsik

[57] ABSTRACT

A nonvolatile memory device includes two floating-gate-type memory arrays, e.g. a flash memory intended to be used as a relatively permanent program memory and an E$^2$PROM intended to be used as a more frequently updated data memory. A single set of address lines and a single set of data lines are used for both read and write operations for both memory arrays. Address decoding means for accessing an addressed location of a selected memory array includes separate column decoders and data latches for each array, but also includes a shared row decoder common to both arrays. Row address latching circuitry associated with at least the data memory holds a decoded row address for that memory array during a write operation so as to free the shared row decoder for use on one or more concurrent read operations for the other memory array, e.g. the program memory. Data I/O buffer circuitry and sense amplifiers are also shared by both arrays. Control logic, responsive to input control signals selecting one of the memory arrays and selecting a read or write operation, controls the various elements of the device, including address and data latches and select/driver circuitry, to carry out the desired operations.

16 Claims, 3 Drawing Sheets

COMBINED PROGRAM AND DATA NONVOLATILE MEMORY WITH CONCURRENT PROGRAM-READ/DATA WRITE CAPABILITY

TECHNICAL FIELD

The present invention relates to nonvolatile semiconductor memories (e.g., EPROMs, Flash Memory, $E^2$PROMs), and in particular relates to a plural memory bank architecture with addressing and read/write circuitry that enables simultaneous read and write operations.

BACKGROUND ART

In U.S. Pat. No. 5,307,314, Lee describes a memory device that is split into banks with separate write enable inputs ($\overline{WEH}$ and $\overline{WEL}$). Both memory banks can be simultaneously accessed, but only at the same address. When both write enable signals are active, the device carries out a word write to both memory banks at the same address location. When both write enable signals are inactive and the single output enable signal ($\overline{OE}$) is active, the device carries out a word read from the same address location in both banks. When only one of the write enable signals is active, the device carries out a byte write to only one bank. The logic circuitry of the device also allows a split read/write operation when one of the two write enable signals is active and the output enable signal is also active. Then, a byte read is carried out from the bank corresponding to the inactive write enable signal, while a byte write is carried out on the other bank corresponding to the active write enable signal, where again both banks are accessed at the same address. Each bank has its own byte wide set of data input/output lines.

In U.S. Pat. No. 5,513,139, Butler describes a memory that has two address decoders, one decoder for read operations and a separate decoder for write operations. The memory also has separate input and output data buses. Both address decoders receive sequentially ordered addresses from an address counter, but decode the address bits so as to scan the rows of memory cells in the opposite direction. Thus, the rows of memory may be written sequentially in ascending order and read from in descending order (or vice versa). Further, the address counter is a binary counter whose outputs supplied to the write decoder are shifted by one bit from the outputs supplied to the read decoder, so that read cycle occurs at twice the rate of the write cycle. The number of memory rows is a multiple of (n+1), where "n" is the ratio of the read frequency to the write frequency (e.g., 2:1), to ensure that no row of memory will be both written to and read from in the same interval.

In U.S. Pat. No. 5,502,683, Marchioro describes a dual-port data cache memory that uses two row decoders, one on each side of the word lines or rows. Each row decoder enables a given word line when its address input indicated that the corresponding row is to be accessed (read from or written to). The storage cells of the activated word line are then accessed by bit lines connected to sense amplifiers or write control circuitry, as appropriate. The rows are organized into words of a given bit length, with column boundaries dividing each row into four words. There are two data ports, each accessing through data multiplexers a different one of the four possible word columns. In order to prevent conflicts between the two row decoders attempting to drive the same word line, access switches are placed in each of the rows at the boundaries between the words. These access switches are normally closed, so that each word line is fully connected. However, when the same row is to be accessed by both row decoders, an access switch is opened by control logic (which includes an address comparator) so as to disconnect that row's word line into two separate sections. In this way, the memory circuit allows independent concurrent access to two different words in the memory array.

In U.S. Pat. No. 5,367,494, Shebanow et al. describe a memory with a plurality of memory banks, each with its own address latch and decoder, its own data input latch and driver, and its own data output latch and driver. Control signals include a read/write signal, address strobe, data in strobe and data out strobe, which are sent to all memory banks, and multi-bit address bank, data in and data out bank address signals, which are first decoded then sent to only a selected memory bank. These control signals enable a selected memory bank to latch in an address, latch in data and drive output data, as requested. This scheme thereby allows time-overlapping memory access of the different memory banks.

In U.S. Pat. No. 5,361,343, Kosonocky et al. describe a system with two nonvolatile memory arrays. Each array has its own address register, decoders, and gating; as well as its own erase and program voltage switches. The arrays share input and output data paths through a common data-in latch, data output multiplexer and input/output buffer. The various registers, switches, multiplexers and enables are controlled by logic that includes an array select circuit which can select one array for a write operation and the other array for a simultaneous read operation.

When designing memory devices that are capable of simultaneous read and write operations considerable duplication of circuitry is provided if addressing flexibility is required. The simpler devices with a minimum of control logic and addressing circuitry are normally limited in their concurrent read/write capability, e.g. to same address access of two memory banks or sequential scanning of addresses. Those memory devices capable of truly random independent access of two or more memory addresses simultaneously typically have at least duplicated addressing circuitry, such as two or more row decoders for the separate read and write operations or for the different memory banks. Often there are separate data input and data output pathways or duplicated data paths for the different requested memory accesses. One reason for the complexity is due to the fact that memory reads take less time to complete than memory write operations. In nonvolatile memory devices, a read operation may take only 150 to 200 ns per address, while a write operation may have a byte load cycle time of about 150 µs and a complete page write may take as much as 10 ms. Thus, it can be seen that one can read from many locations in the time it takes to write just one byte or page of data. The added logic, addressing (and data) circuitry allows one to free up the address lines (and data lines) for read operations, while a write operation is going on at another address with a different set of data bits.

There are some applications which require both a high density program memory which stores program instruction codes that are relatively permanent and a smaller data memory which stores parameters that may need to be frequently updated. A memory device combining both types of memory in a single chip would be desirable. In order to be practicable, such a device would need to be able to read from the program memory while a write operation is being carried out in the data memory.

It is an object of the present invention to provide a combined program and data nonvolatile memory device with concurrent program read and data write capability, where as much of the circuitry as possible is shared without sacrificing independent addressing and data access to the program and data memory arrays.

DISCLOSURE OF THE INVENTION

The object is met by a nonvolatile memory device comprising two memory arrays therein, for example, one intended to be used as a relatively permanent program memory and the other intended to be used as a more frequently updated data memory. The device further includes a single set of address lines and a single set of data lines which are used for both memory arrays. The memory device also has address decoding means that includes a shared row decoder common to both memory arrays, with row address latch means associated with at least the data memory for holding a decoded row address during a write operation so as to free the shared row decoder for use in read operations with the program memory. While both arrays have their own separate column decoders, column select circuits and data latches, they share not only a common row decoder, but also common sense amplifiers, data I/O buffers and control logic. The control logic is responsive to input control signals and controls the various elements of the device to carry out a selected read or write operation in a selected memory array.

BEST MODE OF CARRYING OUT THE INVENTION

Figure 1:
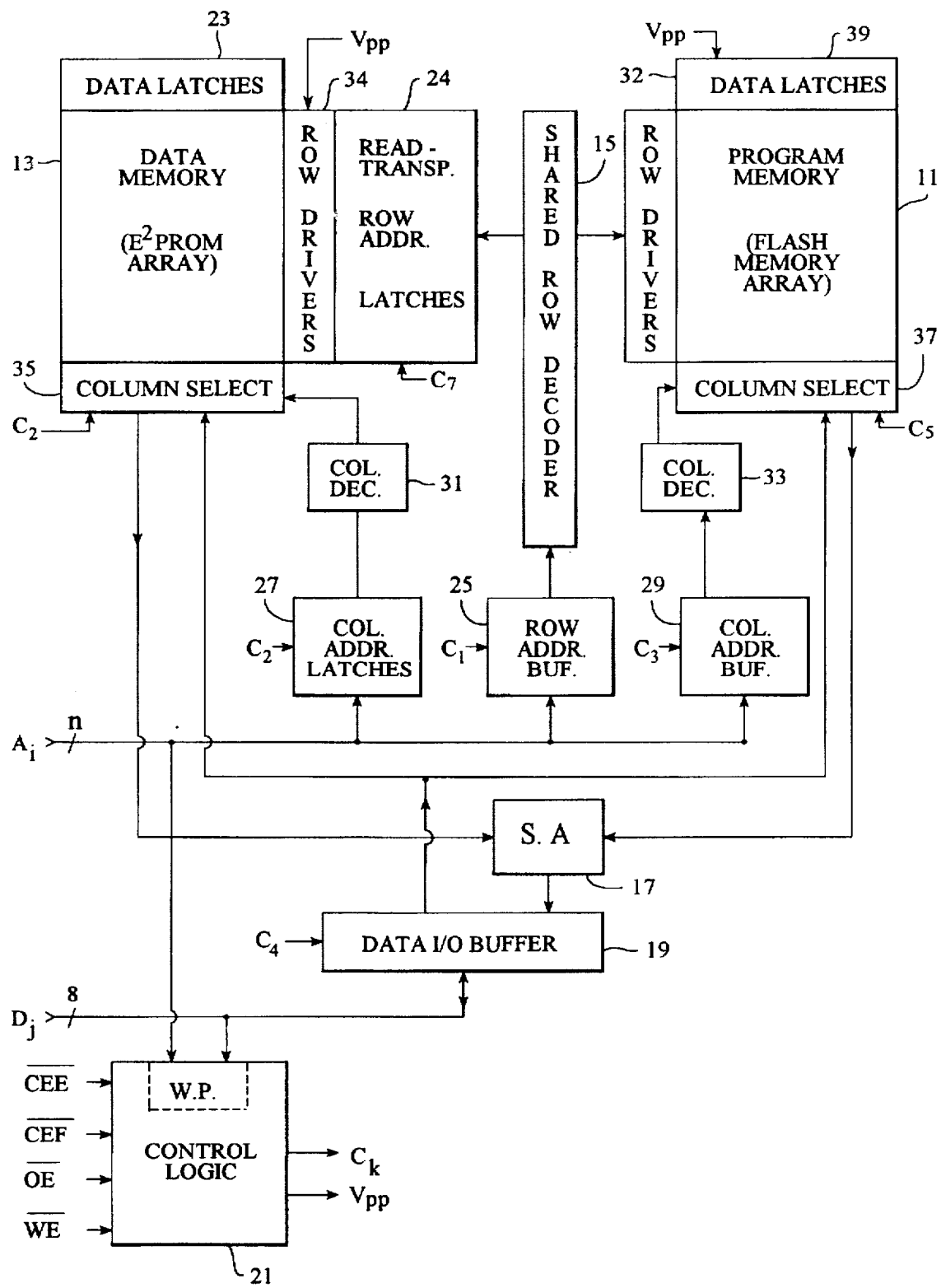
FIG. 1 is a schematic block level plan view of a nonvolatile memory device in accord with the present invention.

With reference to FIG. 1, a nonvolatile memory device of the present invention combines a program memory 11 with a data memory 13. The program memory 11 may be a flash memory array, which is meant to be initially programmed with program instruction codes and only infrequently updated (or not at all). The data memory 13 may be an E²PROM array which is programmed and more frequently updated with data parameters. The two memory arrays 11 and 13 need not be the same size and normally the program memory 11 is much larger than the data memory 13. For example, the program memory 11 might be a 512K×8 flash array (i.e., 4 Mbits) divided for write purposes into 2K 256-byte sectors, while the data memory 13 might be a 32K×8 full-featured E²PROM capable of both single byte and 16-byte page writes. Other memory sizes and data widths are possible.

The two memories 11 and 13 in the device share common address input lines $A_i$, a considerable amount of address decoding circuitry, in particular, a common row decoder 15, common data input/output lines $D_j$, and considerable data circuitry, including shared sense amplifiers 17 and I/O buffer circuitry 19. Control signals for read or output enable $\overline{OE}$ and write enable $\overline{WE}$ are also shared, but there are separate chip enable signals $\overline{CEF}$ and $\overline{CEE}$ corresponding to the flash and E²PROM memory arrays 11 and 13. Control logic 21 for the device is essentially shared by both memory arrays. This degree of resource sharing enables a smaller device to be built with fewer pins required for the address and data, since unnecessary duplication of circuitry and signal paths is avoided. Yet the device is still capable of concurrent access to the two memory arrays 11 and 13. Concurrent access is achieved despite shared addressing and data resources by providing the data memory 13 with a number of latch circuits 23, 24 and 27, especially row address latches 24 that free up the shared row decoder 15 for use by the program memory 11 during write operations to the data memory 13.

Turning first to the particular address circuits of the device, the address inputs $A_i$ are received by address buffers 25, 27 and 29. In the case of the column address bits for the data memory 13, the address buffer 27 may take the form of read-transparent latches to hold these address bits for the duration of a byte write cycle of the data memory. Alternatively, the latching function for the data memory column address could be made part of the column select circuitry 37 after decoding. The other address buffers 25 and 29 could also take the form of latching circuits or may be simple tristate buffers that hold the address signals only for as long as they remain asserted on the address input lines $A_i$. In either case, all address buffers are enabled in response to control signals $C_1$–$C_3$ from the control logic 21. The control logic 21 in turn derives its control signals $C_k$ from the signals $\overline{CEE}$, $\overline{CEF}$, $\overline{OE}$ and $\overline{WE}$ received from the input pins of the device. The row address buffer 25 is enabled by signal $C_1$ whenever either chip enable $\overline{CEE}$ or $\overline{CEF}$ (but not both) is active (low) and either output enable or write enable signal $\overline{OE}$ or $\overline{WE}$ (but not both) is also active (low). The column address buffer 27 for the data memory 13 is enabled by signal $C_2$ whenever the E²PROM chip enable signal $\overline{CEE}$ is active and either output enable or write enable signal $\overline{OE}$ or $\overline{WE}$ is also active. The column address buffer 29 for the program memory 11 is enabled by signal $C_3$ whenever the Flash memory chip enable signal $\overline{CEF}$ is active and either output enable or write enable signal $\overline{OE}$ or $\overline{WE}$ is also active. The address information is input into the buffers 23, 27, 29 on the falling edge of appropriate chip enable signal $\overline{CEE}$ or $\overline{CEF}$ and appropriate output enable or write enable signal $\overline{OE}$ or $\overline{WE}$, whichever occurs last. The condition where both chip enable signals are low or both output and write enable signals are low is invalid and generates no control signals from the logic 21. The row address buffer 25 is assigned the bulk of the address bits, e.g. bits A4 to A14 corresponding to a sector of the 512K×8 flash memory array 11 and a page of the 32K×8 E²PROM array 13. The column address buffers 27 and 29 are assigned the remaining address bits, e.g. bits A0 to A3 of the E²PROM array, and bits A0 to A3 and A15 to A18 of the flash array. Other arrangements of row and column address bits are possible, depending on the size and configuration of the respective memory arrays.

The address information is supplied by the buffers 25, 27 and 29 to address decoding circuitry 15, 31 and 33. Typically, address decoding is carried out in two or more stages, including a first pre-decoding stage followed by a final decoding stage. For simplicity, all stages have been shown lumped together in FIG. 1 into corresponding single decoder circuits 15, 31, and 33. The shared row decoder 15 connects to both memory arrays 11 and 13. In the case of the program memory 11, the row decoder 15 communicates directly with row drivers 32 that activate a selected word line or row corresponding to the decoded row address bits. In the case of the data memory 13, the row decoder 15 connects to a read-transparent latching circuit 24. The latch circuit 24 in turn connects to row drivers 34 that activate a selected word line corresponding to the decoded row address received from the row decoder. During a read operation, the latch circuit 24 is effectively transparent so that the row decoder 15 communicates directly with the selected row driver. But during a write operation, the decoded row address is latched into the row address latches 24 and isolated from the row decoder 15 by pass gates controlled by control signal $C_7$ from the control logic 21 (this occurs when $\overline{WE}$=low and $\overline{CEE}$=low). This frees the row decoder 15 for decoding addresses to be read from the program memory 11. The latches 24 hold the decoded row address for writing to the data memory 13, so that the selected word line continues to be asserted with the programming voltage $V_{pp}$.

The column decoder 31 for the data memory 13 is connected to a column select circuit 35. Likewise, the column decoder 33 for the program memory 11 is connected to a column select circuit 37. The column select circuits 35 and 37 are bidirectional multiplexing and gating circuits that control access of the data paths to a selected column of eight bit lines of the respective memory arrays 11 and 13. The operation of the select circuits 35 and 37 are controlled by signals $C_4$ and $C_5$ from the control logic 21. During a read operation ($\overline{OE}$=low, $\overline{WE}$=high), the selected column of bit lines corresponding to the column address in the enabled memory array 11 or 13 (either $\overline{CEE}$ or $\overline{CEF}$ is low) is connected to sense amplifiers 17. A data input/output buffer 19 responsive to another control signal $C_6$ outputs the sensed byte of data into the data lines $D_j$. During a write operation ($\overline{WE}$=low, $\overline{OE}$=high), the enable column select circuit 35 or 37 (either $\overline{CEE}$ or $\overline{CEF}$ is low) connects the input/output buffer 19 to data latches 23 or 39 for the selected column of bit lines in the enabled memory array 11 or 13. Data received from the data lines $D_j$ is loaded into the selected data latches 23 or 39 from which they can be loaded into the row and column of memory corresponding to the received and decoded address bits $A_i$.

The control logic 21, in addition to generating appropriate control signals $C_k$ in response to the input signals $\overline{CEE}$, $\overline{CEF}$, $\overline{OE}$ and $\overline{WE}$, also controls generation of the high voltage $V_{pp}$ for programming data into the memory cells. In particular, the device may include JEDEC standard software data protection (W.P.). In this scheme, each programming sequence for a sector of flash memory or a byte or page of the E²PROM, must be preceded by a three-byte program command sequence in order for actual programming to take place. This sequence might consist of a specific combination of data bits $D_j$ and address bits $A_i$, typically alternating zeros and ones.

Figure 2A:
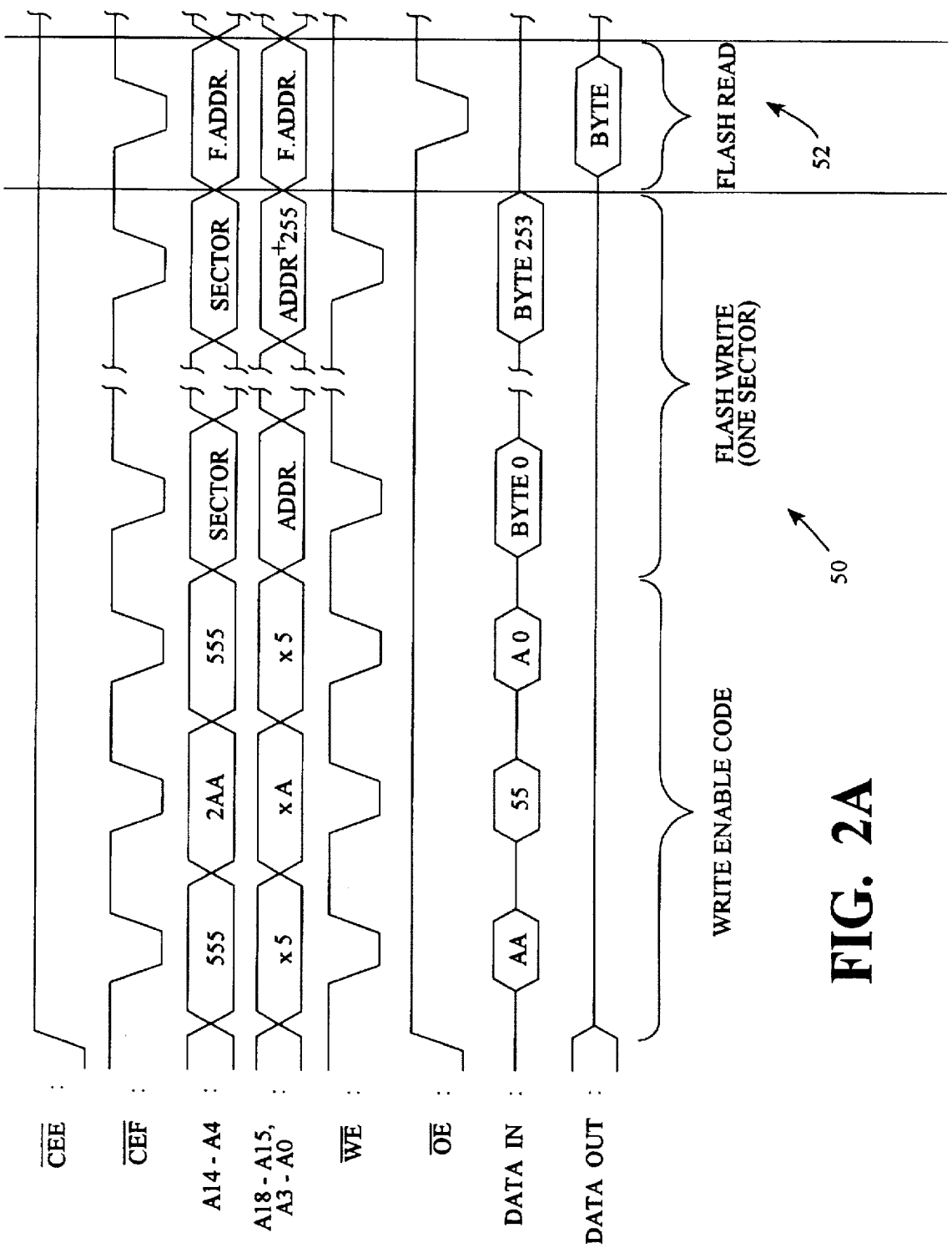
FIGS. 2A and 2B are a timing diagram illustrating read and write operations for each memory array of the device of FIG. 1, including concurrent reading of program memory during a write cycle of the data memory of the device.
Figure 2B:
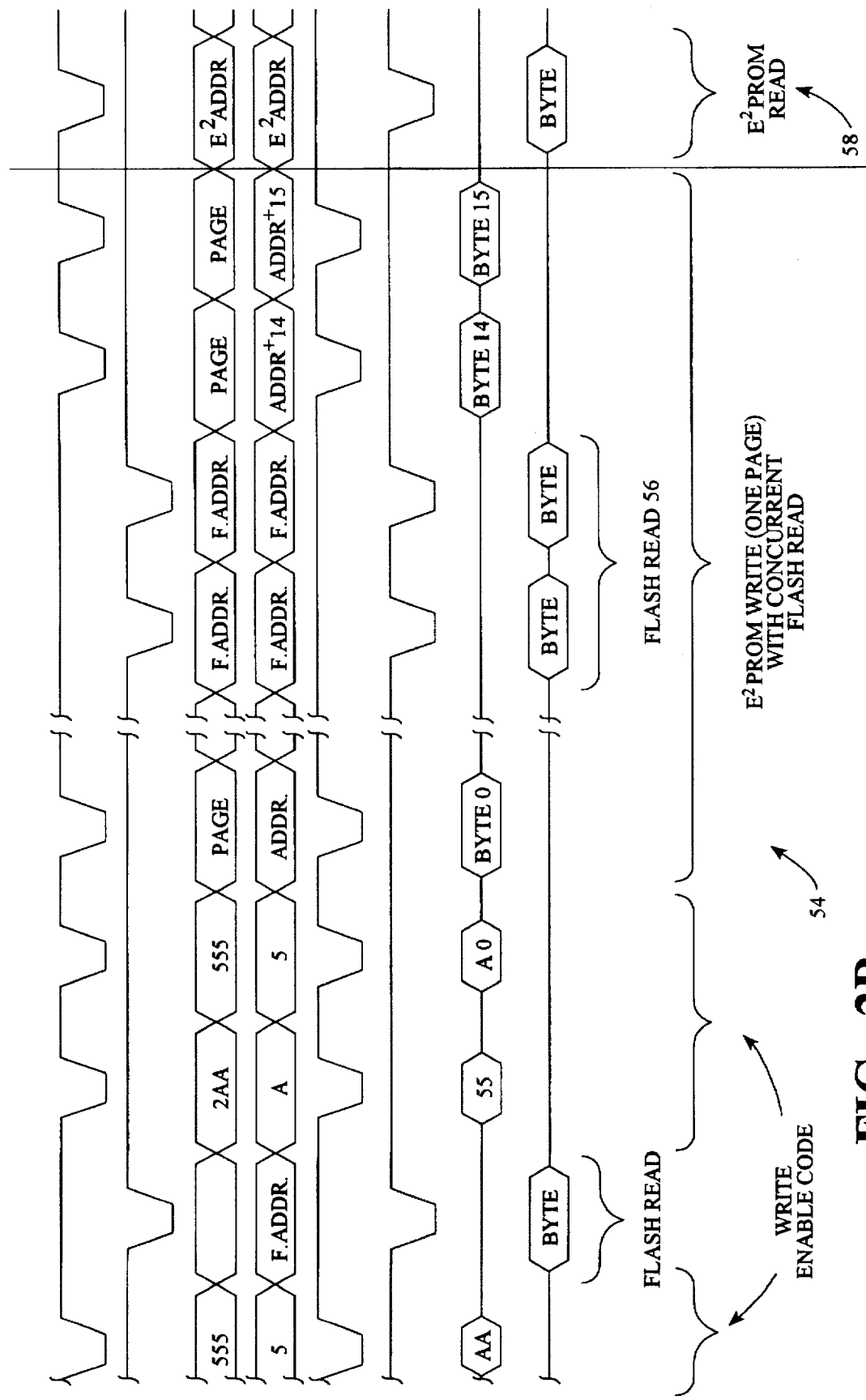

Referring now to FIGS. 2A and 2B, a timing diagram illustrates the main operational features of the present invention. A write operation to the program memory (i.e., the flash memory array 11 in FIG. 1) begins with a three-byte write enable code to override the software write protection. The chip enable signal $\overline{CEF}$ for the flash memory and the write enable signal $\overline{WE}$ pulse low, while a sequence of three addresses and three corresponding sets of data are input into the device. Typically, address bits A18–A15 are ignored, since the write protect logic is also shared by the smaller E²PROM array 13. No actual writing to the flash memory occurs yet, but the sequence causes the control logic to begin allowing generation of a program voltage $V_{pp}$ and starts internal write timers. The flash memory is programmed in 256-byte sectors. An entire sector is erased upon receipt of the sector address on bits $A_{14}$ to $A_4$ prior to programming. No special erase command is needed. Any bytes in the sector that are subsequently left unprogrammed will be indeterminate. The sector address $A_{14}$ to $A_4$ remains unchanged for the duration of the sector write, while the byte address $A_{18}$ to $A_{15}$ and $A_3$ to $A_0$ within the sector changes. While the byte address is typically varied sequentially, this is not essential and byte programming of a flash sector can proceed in any order. In FIGS. 2A and 2B, the byte address for a sector is carried out sequentially from a start address ADDR to a finish address ADDR+255. The corresponding data DATA-IN loaded into the memory is indicated by BYTE 0 to BYTE 255 on the data lines.

A byte load is performed by applying a low pulse on $\overline{CEF}$ and $\overline{WE}$ with a $\overline{CEE}$ and $\overline{OE}$ high. The address is latched on the falling edge of $\overline{CEF}$ or $\overline{WE}$ whichever occurs last, while data is latched on the first rising edge of $\overline{CEF}$ or $\overline{WE}$. Once a byte has been loaded into the data latches of the flash memory array, they are programmed into the memory cells during an internal programming period. The byte write cycle time typically is about 150 µs, although actual loads may take less time. After the first data byte has been programmed, successive bytes are entered in the same manner. Each new byte to be programmed must have its $\overline{WE}$ (or $\overline{CEF}$) high to low transition within 150 µs of the preceding bytes low to high transition of $\overline{WE}$ (or $\overline{CEF}$) or the load period will end. The total write cycle time for a sector of flash memory is typically about 10 ms. No read operations on the E²PROM array are allowed during flash memory's write period and attempts to read the flash memory will effectively be polling operations of the current byte being loaded. Alternatively, modifications to the device of FIG. 1 which include decoded row address latching circuits for the flash memory 11, as well as the E²PROM 13, would allow E²PROM reads during flash memory write operations, if desired.

A flash memory read operation 52 occurs when the flash memory's chip enable signal $\overline{CEF}$ and the output enable signal $\overline{OE}$ pulse low, while $\overline{CEE}$ and $\overline{WE}$ remain high. The flash memory array 11 is read like a static RAM. Reading is carried out on individual bytes, rather than whole sectors. Moreover, for read operations the sectors appear seamless and sector boundaries need not be taken into account. That is, bytes from different sectors may be read successively. When $\overline{CEF}$ and $\overline{OE}$ are low, the data DATA-OUT to be output that is stored at the flash memory location determined by the address inputs to $A_0$ is asserted on the data lines. The maximum read time is typically only 150 to 200 ns per byte.

The data memory 13, typically an E²PROM array, is written to more frequently than the program memory 11. The E²PROM write operation 54 in FIG. 2 illustrates the capability provided by the memory architecture of the present invention of concurrently reading flash memory 11 during the write cycle period of the E²PROM array 13. Write protection is disabled by a 3-byte write enable code sequence, which is typically the same as that for the flash memory, except that now $\overline{CEE}$ pulses low, while $\overline{CEF}$ remains high. Read operations from the flash memory may interrupt loading of the write enable code sequence, as shown, provided the byte load cycle time of 150 µs is not violated. Since a read operation generally takes less than 200 ns to complete, there can be many bytes read from the flash memory between each byte of the code sequence. Once the valid command sequence has been loaded, the write cycle is initiated by both $\overline{CEE}$ and $\overline{WE}$ going low. Once again, the address is latched by the falling edge of $\overline{CEE}$ or $\overline{WE}$ whichever occurs last, while data is latched into latches 23 of FIG. 1 on the rising edge of $\overline{CEE}$ or $\overline{WE}$ whichever occurs first.

All write operations to the E²PROM array must conform to the limits of a page write. That is, while anywhere from a single byte of data to up to sixteen bytes of data may be written, all such bytes during a write cycle must reside on the same page, as defined by the address bits A14–A4. For each high to low transition of the signal $\overline{WE}$, the bits A14–A4 must be the same (PAGE in FIG. 2). The A3 to A0 address bits are used to specify which bytes within the page are to be written. Address bits A18 to A15 do not apply to the smaller E²PROM array and will be ignored. For an entire page write operation, the bytes are normally written sequentially as indicated in FIG. 2 by the input data BYTE 0 to BYTE 15 being loaded into sequential bytes beginning with start address ADDR and ending with address ADDR+15. However, the bytes can be loaded in any order and can be altered within the same load period, if desired. Only bytes which are specified for writing will be erased and written with new data held in the data latches.

Reads 56 from the flash memory array are allowed throughout the E²PROM write cycle time (up to 10 ms) so long as the byte load cycle time of 150 μs for the E²PROM write is not violated. As before, a flash memory read occurs when $\overline{CEF}$ and $\overline{OE}$ pulse low. The data (BYTE) stored at the flash memory location (F.ADDR) determined by the address inputs A18 to A0 will be sensed and output on the data lines. Many reads can be performed in the time available. Attempts to read the E²PROM array ($\overline{CEE}$ and $\overline{OE}$ low) during the E²PROM write cycle will produce a polling operation of the data held in the latches 23.

The E²PROM read operation 58 is performed just like the flash read operation 52 except that now the E²PROM array is selected ($\overline{CEE}$=low). The data (BYTE) stored at the memory location (E²ADDR.) determined by the address inputs A14–A0 will be sensed and output onto the data lines. An E²PROM read cannot be performed during any of the write cycles.

The device of the present invention is intended to be used to store infrequently updated program information in one memory array and more frequently updated data parameters in another memory array. The architecture allows concurrent reading of the program memory during writes to the data memory, while eliminating much duplication in addressing and data hardware. The data memory's address latches, free up the row decoder for performing read operation decoding for the program memory during the time period when data held in the data memory's data latches are actually programmed into memory cells. Thus, only one row decoder is needed. Alternative devices could have both memory arrays with independent address latches and drivers, so that read operations can be performed in either memory array while the other is completing a write operation. Only a single set of data and address inputs are needed for read and write of both arrays.

We claim:

1. A nonvolatile memory device, comprising
   a first nonvolatile memory array,
   a second nonvolatile memory array,
   a single set of address lines at least a portion of which being common to both memory arrays,
   address decoding and select means connected to said address lines to receive address signals therefrom for accessing a memory location in a selected one of said memory arrays, said address decoding and select means including a shared row decoder that is common to both memory arrays for accessing in said selected memory array a word line corresponding to said address signals,
   address latch means, associated with said first memory array and in communication with said address decoding means, for holding a decoded address during a write operation to said first memory array, whereby said address decoding and select means is free to access other memory locations for concurrent read operations from said second memory array,
   a single set of data lines common to both memory arrays,
   a single set of sense amplifiers common to both memory arrays and communicable by means of said address decoding and select means with selected bit lines corresponding to addressed locations of said selected memory array, said sense amplifiers connecting said selected bit lines to said data lines for a read operation from said selected memory array,
   first and second data latch means connectable by means of said address decoding and select means to said single set of data lines and to bit lines of said respective first and second memory arrays for holding data received from said data lines during a write operation to said selected memory array, and
   control means responsive to input control signals for selecting one of said memory arrays and selecting a read or write operation for said selected memory array.

2. The memory device of claim 1 wherein said first memory array is an E²PROM array.

3. The memory device of claim 1 wherein said second memory array is a flash memory array.

4. The memory device of claim 1 wherein said address decoding and select means includes a separate column decoder and a separate column select circuit for each memory array.

5. The memory device of claim 1 wherein said address latch means for said first memory array is effectively transparent during a read operation of said first memory array and isolates said held decoded address from said address decoding and select means until completion of a write operation for said first memory array.

6. The memory device of claim 1 further including second address latch means associated with said second memory array for holding a decoded address during a write operation for said second memory array.

7. The memory device of claim 1 wherein said memory arrays have different sizes, a larger of said memory arrays requiring all of said address lines for access to selected locations of that larger memory array, a smaller of said memory arrays requiring only a subset of said address lines for access to selected locations of that smaller memory array.

8. The memory device of claim 1 wherein said input control signals include a first set of signals selecting one and only one of said memory arrays and a second set of signals enabling one and only one of a read or write operation.

9. A nonvolatile memory device, comprising
   a first nonvolatile memory array,
   a second nonvolatile memory array,
   a set of address lines for receiving signals representing address bits thereon designating a specified location in said memory arrays, the address lines including row address lines and column address lines, at least a portion of the address lines being common to both memory arrays,
   first and second column decode and select circuitry, both in signal communication with said column address lines to receive address bits therefrom, the first column decode and select circuitry accessing selected bit lines corresponding to said address bits in said first memory array, the second column decode and select circuitry accessing selected bit lines corresponding to said address bits in said second memory array,
   a shared row decoder in signal communication with said row address lines to receive address bits therefrom, the row decoder accessing selected word lines corresponding to said address bits in a selected one of said first and second memory arrays, a row address latch circuit associated with the first memory array and in communication with said shared row decoder for holding the word line selection for the duration of a write operation to the first memory array, whereby said shared row decoder is free to access other word lines for concurrent read operations from the second memory array during the write operation to said first memory array, a set of data lines common to both memory arrays, a set of data latches for each memory array and associated with the bit lines thereof, said data latches connectable through said respective first and second column decode and select circuitry to said data lines for a write operation to a selected one of said memory arrays, a set of sense amplifiers shared by both memory arrays, said sense amplifiers communicable through said respective first and second column decode and select circuitry with bit lines in a selected memory array for a read operation therefrom, outputs of said sense amplifiers connected to said set of data lines, and control means responsive to input control signals for controlling operation of at least said first and second column decode and select circuitry and said row address latch circuit to carry out a selected read or write operation in a selected memory array.

10. The device of claim 9 wherein said first data memory array is an $E^2$PROM array.

11. The device of claim 10 wherein said $E^2$PROM array has both single byte and page mode write capability.

12. The device of claim 9 wherein said second memory array is a flash memory array.

13. The device of claim 9 wherein said second memory array has a larger memory capacity than said first memory array, said second memory array requiring all address lines for access thereto, said first memory array requiring less than all address lines for access thereto.

14. The device of claim 9 wherein said first and second column decode and select circuitry includes directional gating circuits for connected selected bit lines to said sense amplifiers for a read operation and for connecting said data lines to data latches corresponding to selected bit lines for a write operation.

15. The device of claim 9 wherein said row address latch circuit is transparent to said shared row decoder and said word lines during a read operation for said first memory array.

16. The device of claim 9 wherein said input control signals include a first set of signals selecting one and only one memory array and a decode set of signals selecting one and only one read or write operation for the selected memory array.

* * * * *